United States Patent [19]

Jove et al.

[11] Patent Number: 4,879,610
[45] Date of Patent: Nov. 7, 1989

[54] PROTECTIVE CIRCUIT FOR A MAGNETORESISTIVE ELEMENT

[75] Inventors: Stephen A. Jove, Watsonville; Klaas B. Klaassen; Calvin S. Nomura, both of San Jose; Jacobus C. L. vanPeppen, San Jose, all of Calif.

[73] Assignee: International Business Machines Corporation, Armonk, N.Y.

[21] Appl. No.: 250,784

[22] Filed: Sep. 28, 1988

[51] Int. Cl.$^4$ .......................... G11B 5/02; G11B 5/127
[52] U.S. Cl. ........................................ 360/67; 360/113
[58] Field of Search ................. 360/67, 113; 324/249, 324/252; 330/60

[56] References Cited

U.S. PATENT DOCUMENTS

| | | | |
|---|---|---|---|
| 4,492,997 | 1/1985 | Arai et al. | 360/113 |
| 4,660,113 | 4/1987 | Nomura et al. | 360/113 |
| 4,706,138 | 11/1987 | Jove et al. | 360/67 |
| 4,712,144 | 12/1987 | Klaassen | 360/67 |
| 4,786,993 | 11/1988 | Jove et al. | 360/113 |

Primary Examiner—Vincent P. Canney
Attorney, Agent, or Firm—Otto Schmid, Jr.

[57] ABSTRACT

A protective circuit for a magnetoresistive (MR) element having a first and a second terminal in which a first current source is coupled to the first terminal of the MR element to produce a bias current through the MR element and a second current source is coupled to the second terminal of the MR element to produce a reference current. Circuit means coupled across the MR element senses the center potential of the MR element substantially midway between the first and second terminals, and a feedback circuit responsive to the sensed center potential is coupled to adjust the current output of the first current source to maintain the center potential to a selected reference voltage to protect the MR element from short circuits to a conductive area of the magnetic recording medium. A second feedback circuit is provided which comprises a pair of transistors coupled in a differential pair configuration and a transconductance stage which feeds back a signal as a current to the transistors which keeps the dc currents through each of the transistors equal, and the transistors provide an amplified output signal which is a function of the magnetic flux being sensed by the MR element.

25 Claims, 4 Drawing Sheets

PROTECTIVE CIRCUIT FOR A MAGNETORESISTIVE ELEMENT

BACKGROUND OF THE INVENTION

1. Field of the Invention

This invention relates to circuits for amplifying signals produced by a magnetoresistive element, and more particularly to such circuits for protecting the magnetoresistive element from the occurance of undesirably large currents.

2. Description of the Prior Art

The prior art discloses a magnetic transducer referred to as a magnetoresistive (MR) sensor or head which has been shown to be capable of reading data from a magnetic surface at high linear densities. An MR sensor detects magnetic field signals through the resistance changes of a read element made from a magnetoresistive material. This resistance change is a function of the magnitude and direction of magnetic flux being sensed by the element.

U.S. Pat. No. 4,492,997 discloses an MR head in which the MR element is a two terminal device connected to serve as a portion of the negative feedback resistor of an amplifier circuit so that the amplifier circuit serves both to supply a drive current to the MR element and to amplify the signal derived from the MR element.

U S. Pat. No. 4,660,113 discloses an MR sensor in which the MR element has three terminals with the center terminal connected to ground potential. The outputs from the other two terminals are differentially amplified by a differential amplifier to eliminate external noise signals picked up by the head.

In magnetic recording technology it is continually desired to improve the areal density at which information can be recorded and reliably read. This desire has let to a trend toward greater bit density along a magnetic recording track and a shrinking track width. The greater bit density requires increasingly narrow transducing gaps, increasingly narrow track width, and progressively lower flying height to reliably record and read data.

The MR elements required to meet these requirements are generally small. This factor, along with the lower flying height, leads to an increased chance of damage to the MR element due to currents flowing between the element and its environment. One example is the current caused by intermittent contact between the element and the magnetic recording disk which ca lead to intermittent shorts of the element to the magnetic disk substrate potential. Another example is the current flowing due to galvanic corrosion between the material of the element and the disk magnetic coating or substrate materials in a humid atmosphere.

Commonly assigned U.S. Pat. Nos. 4,706,138 to Jove et al and 4,712,144 to Klaassen disclose circuits for amplifying signals produced by an MR element. These circuits have been shown to operate effectively in amplifying signals produced by the small MR sensors described above.

However, neither the above-mentioned patents nor any other known prior art provide a circuit for protecting the MR element from these damaging currents to the environment of the MR element.

SUMMARY OF THE INVENTION

It is therefore the principal object of this invention to provide a protection circuit for an MR element which prevents damage to the MR element due to currents to or from the magnetic recording medium.

In accordance with the invention, a protective circuit for a magnetoresistive (MR) element comprises an MR element having a first and a second terminal. A first current source is coupled to the first terminal of the MR element to produce a bias current through the MR element, and a second current source is coupled to the second terminal of the MR element to produce a reference current. Circuit means are coupled across the first and second terminals of the MR element for sensing the center potential of the MR element, substantially midway between the first and second terminal of the MR element, and feedback circuit means responsive to the sensed center potential of the MR element is provided to adjust the current output of the first current source to maintain the center potential to a predetermined reference voltage. To prevent damage to the MR element in the event of contact between the MR element and conductive areas of the magnetic recording medium, this reference voltage is chosen such that the discharge current of the (parasitic) capacitance between the MR element and the substrate is kept small. Preferably, this reference voltage is equal to the substrate voltage.

It is another feature of the invention that the signal across the MR element can be amplified to produce a signal voltage varying as a function of the magnetic flux being sensed by the MR element. In this case a second feedback circuit is provided to compensate the dc voltage sensed across the MR element, essentially removing this dc voltage produced by the bias current across the head and leaving only the signal voltage.

It is a further feature of the invention that a plurality of input circuits can be provided each of which is coupled to a following amplifier stage, and switching means are provided to select a predetermined one of the input circuits for sensing the output signal as a function of the magnetic flux being sensed by the selected MR sensor while the MR element is coupled in the protective circuit of the present invention.

The foregoing and other objects, features and advantages of the invention will be apparent from the following more particular description of a preferred embodiment of the invention as illustrated in the accompanying drawings.

DETAILED DESCRIPTION OF THE PREFERRED EMBODIMENT

The basic concept for the implementation of a low-noise and high-bandwidth differential preamplifier having short circuit protection for the magnetoresistive (MR) element will be described with reference to FIG. 1. A first current source Iref is coupled to a first terminal of the MR element Rh and a second current source J1 is coupled to a second terminal of the MR element Rh. A first feedback loop is provided to control current source J1 relative to Iref so that the MR element is properly biased and the electrical center of Rh is set to a desired potential Vcenter. The first feedback loop comprises a resistor network comprising equal resistors R connected across MR element Rh to derive the head-center potential and a differential amplifier B which compares this head-center potential and a desired potential Vcenter. The resistors R are much greater in resistance than Rh. The output of differential amplifier B is coupled to control the second current source J1. This protective circuit operates on the basis of maintaining the current into the MR element equal to the current out of the MR element to null any ground return current that might flow when any exposed portion of the element is shorted to the disk substrate, which is usually grounded. To that end the controllable current source J1 is made to only slowly respond to the control signal from amplifier B. A short-duration conductive contact will therefore not upset the current balance between current source J1 and current source I ref. In addition, the electrical center voltage of the element can be maintained at any desired potential. To protect against short circuits to a conductive area of the magnetic recording medium, the desired potential would logically be selected as ground potential to also protect against any capacitive discharge of the parasitic capacitance from the MR element and its connecting leads to ground.

Should it be desired to protect the MR element from galvanic corrosion damage, a small negative potential of the same order of magnitude as the galvanic cell voltage of the pertinent material combination would be selected as the desired potential, Vcenter.

A second feedback loop is provided inside gain block A to suppress the large dc component of the bias voltage developed across the MR element, which results in amplification of only the small high-frequency (data) signal.

Figure 1:
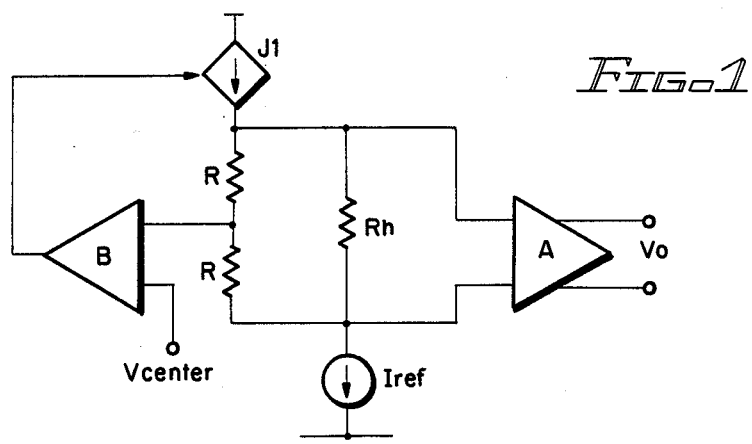
FIG. 1 is a block diagram of the basic concept of a circuit constructed according to the principles of the present invention.
Figure 2:
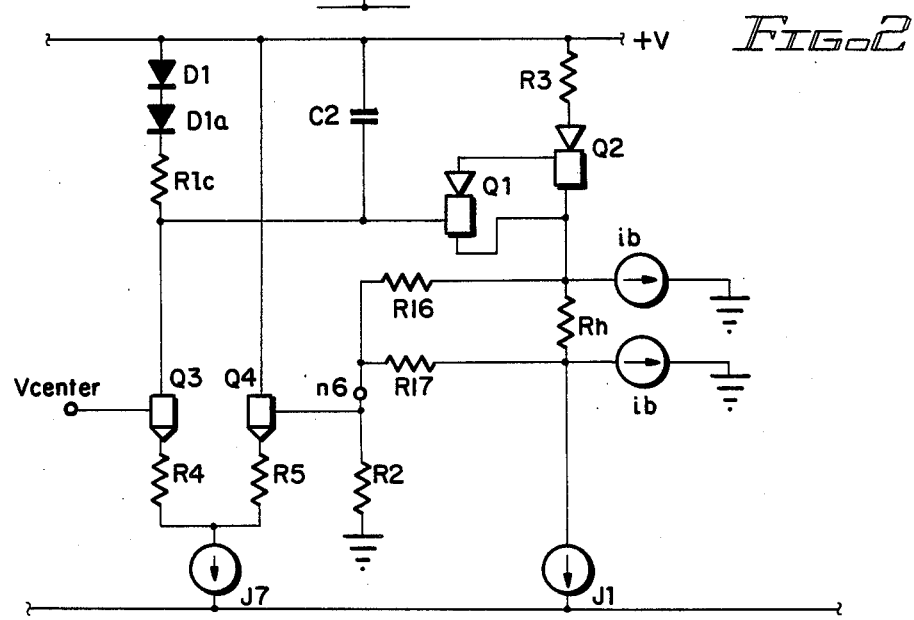
FIG. 2 is a circuit diagram of a first feedback loop of a circuit implemented according to FIG. 1.

The detailed circuit of the first feedback loop of FIG. 1 is shown in FIG. 2. The currents ib represent the non-zero base biasing currents needed for the input transistors of gain block A in FIG. 1. Resistors R16, R17, and R2 develop the MR element center potential for the differential amplifier B which comprises transistors Q3 and Q4. Resistors R4 and R5 are used to control the loop gain of the first feedback loop. Capacitor C2 sets the dominant time constant of the feedback loop which determines the response time of J1 in FIG. 1 to a change in the electrical center potential. The PNP Darlington pair consisting of Q1 and Q2 are used to insure a high impedance at the base of Q1 to minimize capacitance needed even with low beta PNP devices. Diodes D1 and D1$a$ thermally compensate the loop. Current source J7 is used as both a biasing source for the differential amplifier B and as a feedforward current to insure minimum steady state error under all statistical conditions. Although Vcenter can be a wide range of voltage potentials, for purposes of protecting the MR element from shorts to a conductive asperity on a disk with a grounded substrate, this potential is chosen as ground potential. As pointed out above, galvanic corrosion protection can be provided by choosing Vcenter to be a small negative voltage.

If Vcenter is at ground potential and diodes D1 and D1$a$ have similar base-to-emitter voltages as do Q1 and Q2, then the following applies:

$$Vcm = \left(\frac{R1'J7}{2R3'} - J1 - 2ib\right) \frac{\frac{R16}{2} + R2}{1 + \frac{R2R1'}{R3'(R4' + R5')}} \quad [1]$$

where
Vcm = actual voltage at center of MR element
$R1' = (4(Vt/J7) + R1c) || \beta p^2 R3'$
where || means in parallel with
$R3' = Vt/J7 + R3$
$R16 = R17 = R2$
$R4' = R5' = R4 + 2(Vt/J7)$
$Vt = 26$ mV
$\beta p$ = current gain of PNP devices
ib = base current of input stage to preamplifier $$Isib = \frac{-Rh(J1 + ib)}{2Rh + 3R16} \quad [2]$$

$$Isit = -Isib \quad [3]$$

$$Isfb = \frac{\frac{J7}{2} - ib\frac{R3'}{R1'}}{\frac{R3'}{R1'} + \frac{RhR16}{(2Rh + 3R16)(R4' + R5')}} \cdot \frac{3R16 + Rh}{3R16 + 2Rh} \quad [4]$$

$$Isft = \left\{\frac{J7}{2} + \frac{(J1 + ib)R16Rh}{(R4' + R5')(3Rh + 3R16)}\right\}\frac{R1'}{R3'} - \frac{(3R16 + Rh)(ib + J1)}{(3R16 + 2Rh)} - ib \quad [5]$$

where
Isib = initial short circuit current from most negative head terminal to ground (time=0+)
Isib = initial short circuit current from most negative head terminal to ground (time=0+)
Isit = initial short circuit current from most positive head terminal to ground
Isfb = final short circuit current from most negative head terminal to ground (time=∞)
Isft = final short circuit current from most positive head terminal to ground $$\tau = R1'C2$$

$$GL = \text{Loop Gain} = \frac{R1'R2}{R3'(R4' + R5')} \quad [6]$$

$$\tau = \frac{\tau'}{GL} = \text{dominant closed loop time constant} \quad [7]$$

Figure 3:
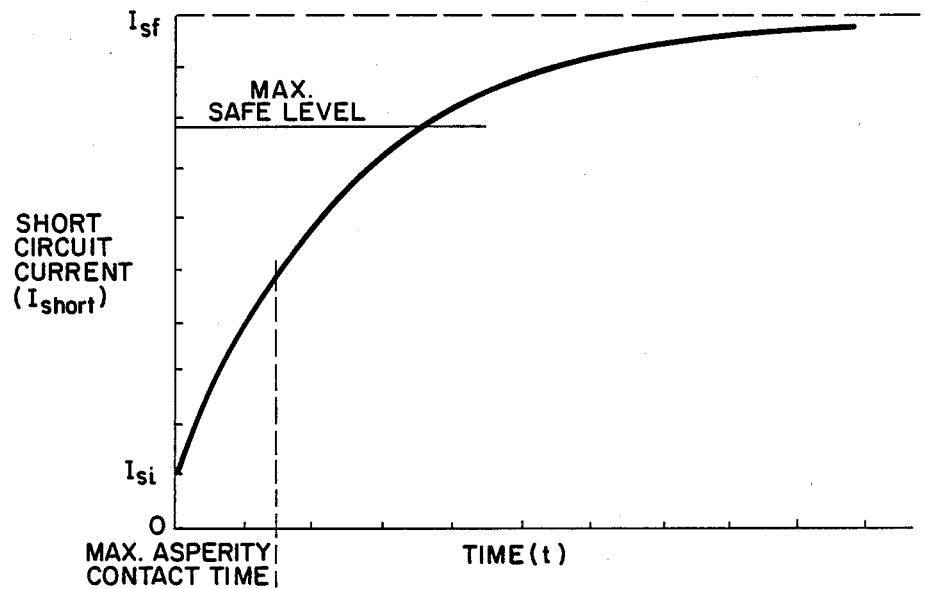
FIG. 3 is a graph showing the short circuit current for an MR element protected by this invention.

The short circuit current in accordance with the above equations is shown in FIG. 3. The current starts at Isi at time t=0 and has an exponential characteristic up to a final current of Isf. The characteristic shown is dominated by a relatively slow loop response needed for a low maximal allowed short circuit current. This is indicated by the max safe level threshold in FIG. 3. To insure that the short circuit current never exceeds the max safe level, the duration of the short cannot exceed a maximum asperity contact time. By reference to Equation (1) it can be seen that current J7 (FIG. 2) acts as a feedforward current which can set the steady state error to zero in the nominal case. Since most short circuits between the magnetic recording medium and the MR element are transitory in nature, the circuit provides adequate short circuit protection.

It is important to provide short circuit protection even for the transitory short circuits which may occur, since these transitory short circuits can result in erosion of a micro-area of the material forming the MR element. The cumulative effect of this erosion of micro-areas produces a recession of the sensing edge of the MR element which faces the magnetic recording medium, and this recession results in a significant reduction in the sensitivity of the MR element. Of course, short circuit currents of a larger magnitude have greater impact which may result in a greater and more rapid decrease in sensitivity of the MR element. Applicants' circuit as described above provides adequate short circuit protection against these transitory short circuits and can keep these currents well below a safe maximum allowable level. It also provides protection for capacitive discharge damage to the MR element. It can provide protection from galvanic corrosion as well.

Greatly increased short circuit protection can also be achieved by considering a nonlinear effect, that of slew rate limitation, which can be dominant over the linear time constant of the biasing loop described above, upon the proper selection of certain component values.

When a short circuit to ground occurs at either end of the MR element, then a charging current IΔ for capacitor C2 can be defined as $$I\Delta = \frac{J7}{2} + \frac{Vcm + (J1 + ib)\frac{Rh}{2}}{R4' + R5'} \quad [7a]$$

The change in voltage across capacitor C2 needed to cause shorting currents Isfb or Isft is VΔ where $$V\Delta = IsR1' \quad [7b]$$

The time needed to charge the capacitor sufficiently to attain shorting currents Is is then TΔ where $$T\Delta = C2(V\Delta/I\Delta) \quad [7c]$$

If J7 is made small and C2 is made large, then the time required before a specified Is can flow becomes considerably longer, because of the inherent slew rate limitation non-linearity, than the previous linear time constant described above.

Figure 4:
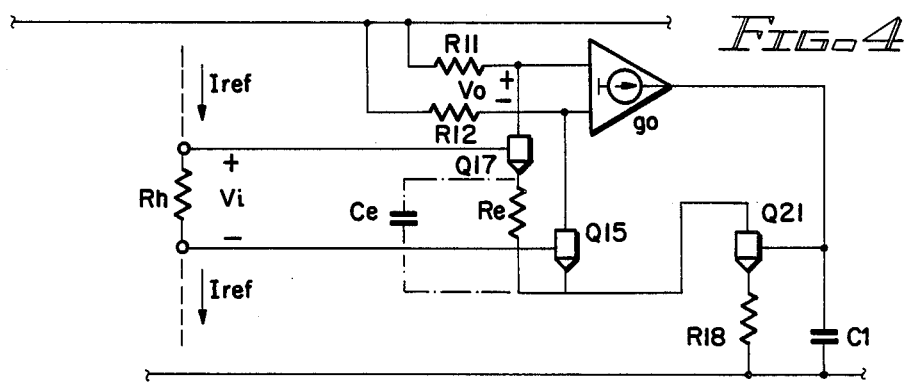
FIG. 4 is a circuit diagram of the second feedback loop of a circuit implemented according to FIG. 1.

Feedback loop number two inside the gain block A in FIG. 1 is shown generally in FIG. 4 in which input devices Q17 and Q18 correspond to amplifier A and amplify the signal voltage Vi at the MR element. Transconductance stage (go) feeds back the amplified signal Vo as a current to the base of current source transistor Q21. Capacitor C1 generates a dominant time constant for the loop, thereby producing a high-pass response of Vo relative to Vi. The total biasing current for the differential input stage consisting of Q17 and Q18 changes as different values of Rh are used. The reason for this is that the voltage developed across resistor Re is made equal to the biasing voltage across head resistance Rh by adjusting the dc current through Q21 to keep the dc currents through each input device equal. In general Re can be bypassed by capacitor Ce to generate impedance Ze in order to reduce the amplifier noise as shown dotted in FIG. 4.

Figure 5:
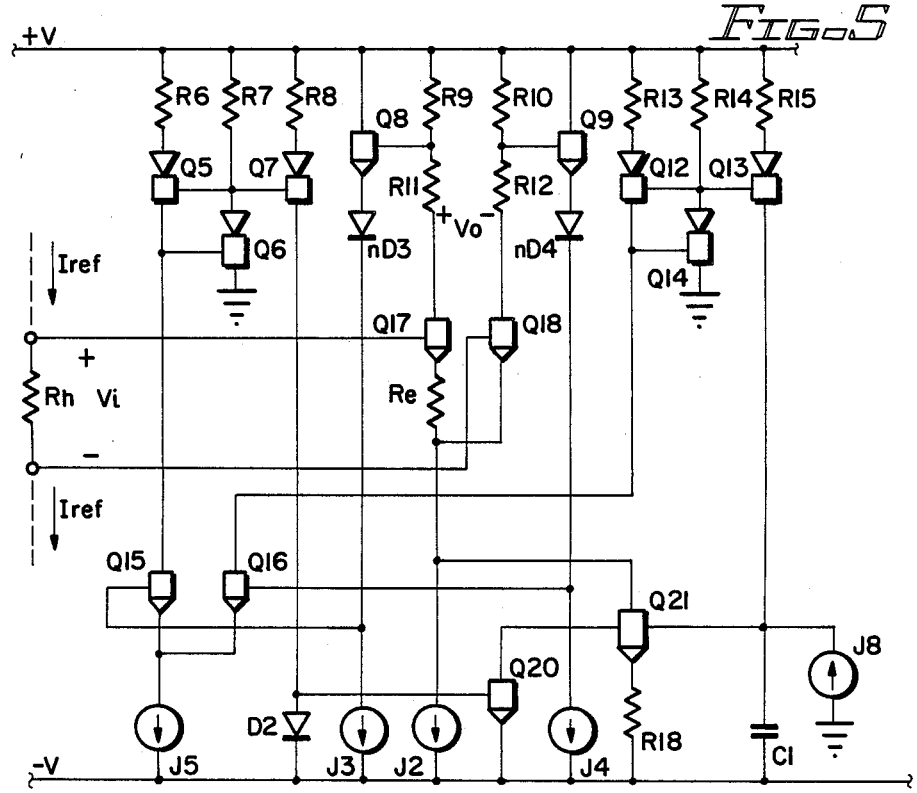
FIG. 5 is a more detailed circuit diagram of FIG. 4.

A more detailed schematic of transconductance stage go is shown in FIG. 5. Here, only a fraction of the output signal Vo is fed back by two equivalent resistor divider networks comprising respectively R9/R11, and R10/R12 and a differential voltage follower consisting of Q8 and Q9, series diodes nD3 and nD4 and bias currents J3 and J4. A voltage to current conversion is accomplished by differential pair Q15 and Q16 and bias source J5. The output currents of this stage are mirrored and the differential current is fed to capacitor C1. The charging current is mirrored by one PNP current mirror consisting of transistors Q12, Q13 and Q14 and resistors R13, R14 and R15. The discharging current is mirrored by a PNP mirror and an NPN mirror. The PNP mirror consists of transistors Q5, Q6 and Q7, and resistors R6, R7 and R8. The NPN current mirror consists of diode D2 and transistor Q20. Current J2 is used as a feed-forward current which supplies the minimal current needed for the minimum resistance of Rh to the input stage. Current J8 supplies an additional feedforward current which, when combined with feedforward current J2, will result in the correct current supplied to the input stage for the nominal case resistance of Rh being used. Thus currents can be added to (or subtracted from) current J8 via the current output of the second feedback loop to obtain correct biasing currents for the input devices for all values of Rh. Since the NPN mirror may become close to saturation, especially when the collector current of Q21 becomes very small (as it is with a minimum value for the resistance of Rh), it becomes necessary to construct the mirror such that staturation cannot occur. Thus the simple topology of the NPN current mirror is one solution, in tandem with insuring that the collector current of Q21 will be well above zero even with a minimal value of Rh. This can be done by decreasing the amount of feedforward current from J2 slightly, and increasing the value of feedforward current from J8 correspondingly, relative to the initial settings previously discussed.

The important equations characterizing the second feedback loop are:

$$H(s) = \frac{Vo}{Vi'} = \frac{-2RL(s\tau'' + 1)}{(sA\tau'' + 1)\left(Re + 2re + \gamma K\beta nRe\frac{RL}{re'}\right)} \quad [8]$$

Where H(s) does not include the effects of internally applied feedforward by J2 and J8 and where
RL=R9 +R11
re=(VtRe/J1Rh)
$\gamma$=(R11/R9+R11)
re'=2 (Vt/J5)
K=current gain of PNP mirrors assuming that the gain of the NPN mirror=1
$\beta n$=beta of NPN devices
s=Laplace operator
and where:

$$\tau'' = \beta n C1(R18 + re'') \quad [9]$$

$$re'' = \frac{Vt}{2J1\frac{Rh}{Re} - J2 - \beta nJ8} \quad [10]$$

$$A = \frac{2re + Re}{Re + 2re + \frac{\gamma K\beta nReRL}{re'}} \quad [11]$$

$$Vo(dc) = \frac{(J2 + \beta nJ8)Re - 2J1Rh}{1 + \frac{2re + Re}{RL}} \quad [12]$$

where Vo(dc) is the dc output offset at Vo with internal feedforward and base biasing currents ib=J1Rh/Re$\beta$n.

Figure 6:
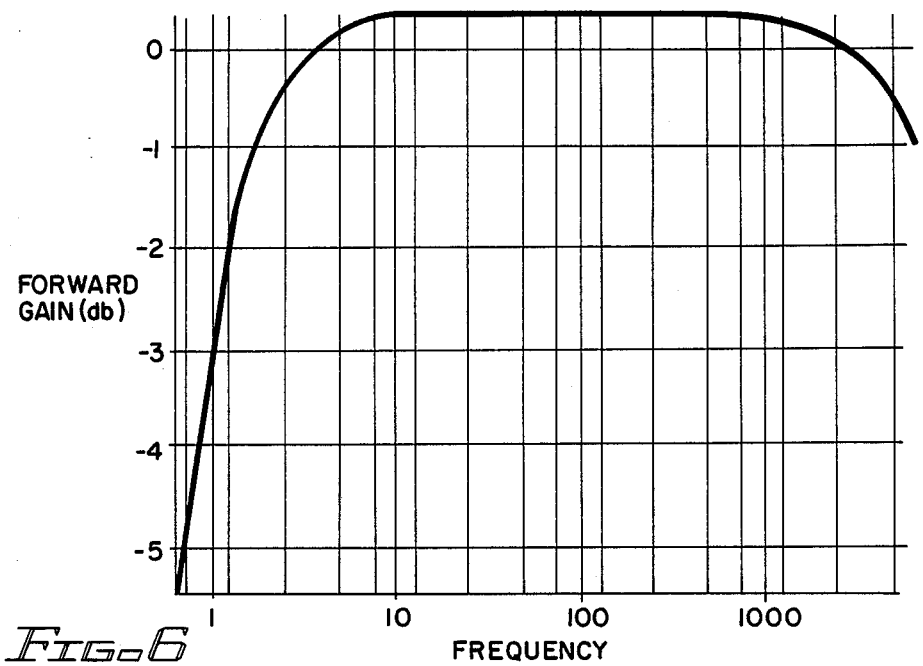
FIG. 6 is a Bode diagram illustrating the frequency response of the signal path of the amplifier constructed according to FIGS. 1, 2, 4 and 5.

The ac response of the amplifier is shown on the Bode plot of FIG. 6. Here, the dominant low frequency pole of the second feedback loop results in the low frequency rolloff shown.

Figure 7:
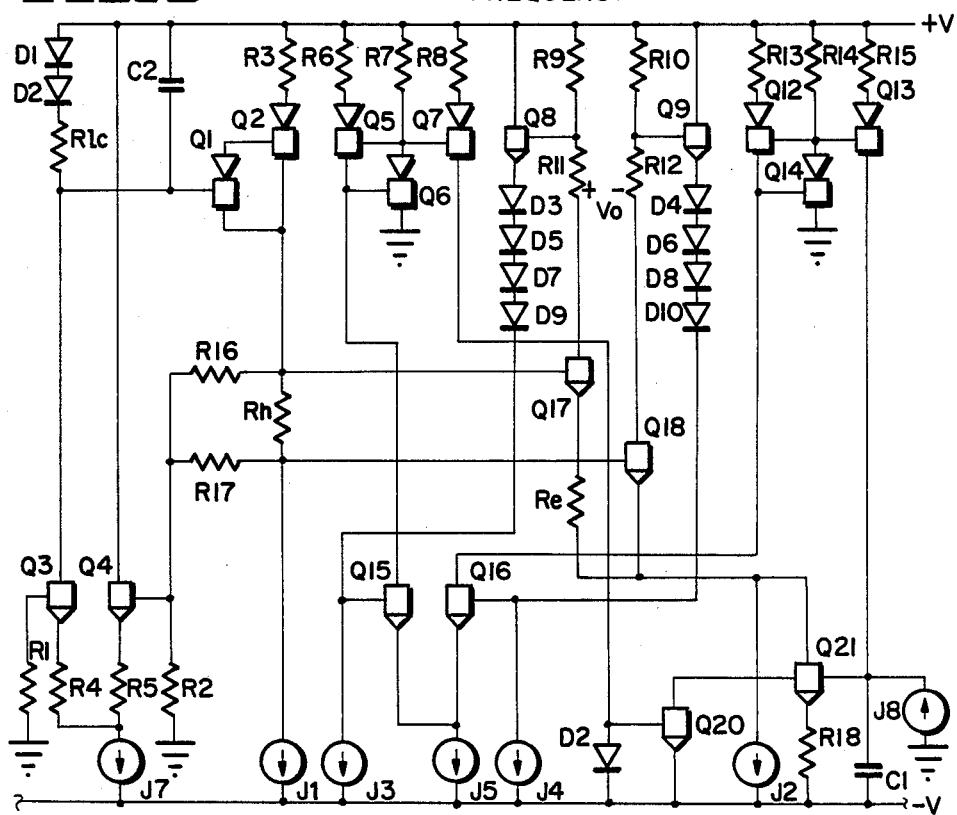
FIG. 7 is a more detailed circuit diagram of the amplifier and biasing circuit components.

The biasing and amplifying circuit components are shown interconnected in FIG. 7. Here, extra diodes are shown in the voltage follower stage to alleviate dynamic range constraints caused by a common-mode voltage change at Vo because the circuit must operate with a rang of resistances Rh.

Figure 8:
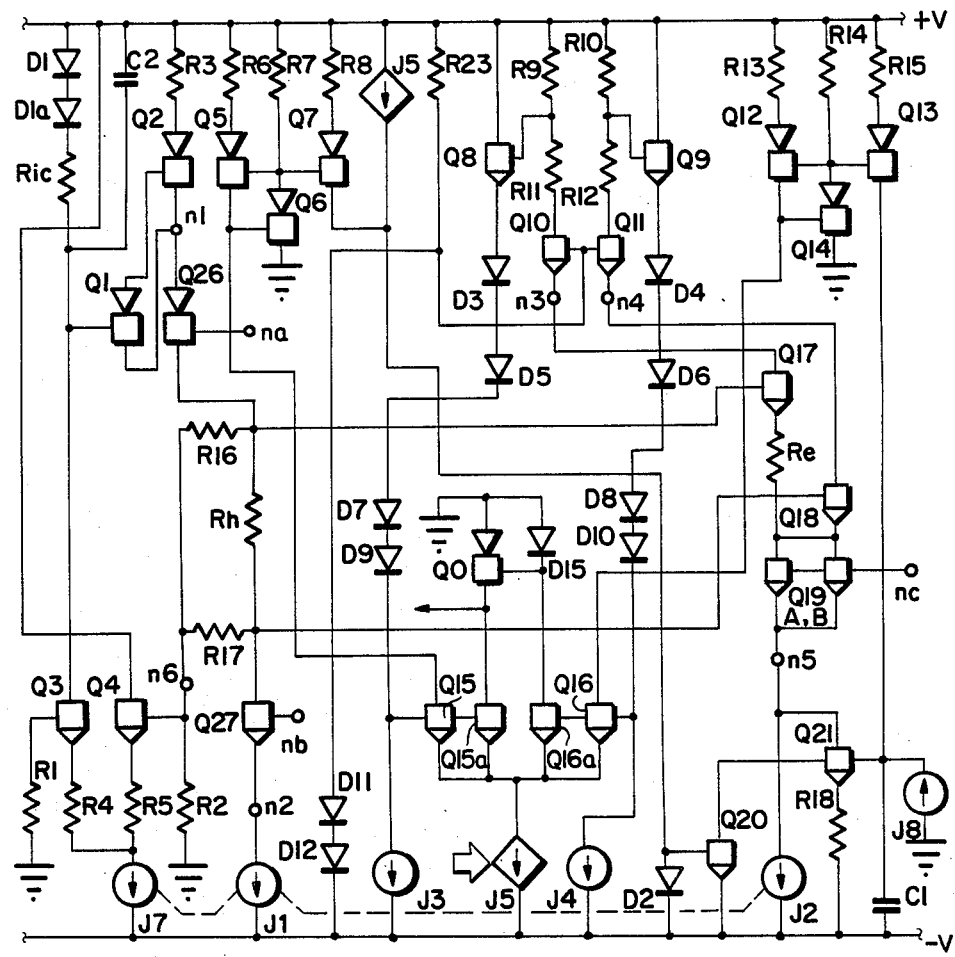
FIG. 8 is a circuit diagram of a complete preamplifier showing nodes related to and capable of switching from one head to another.

The complete preamplifier capable of switching from one head to another is shown in FIG. 8. A cascode stage consisting of transistors Q10 and Q11, diodes D11 and D12 and resistor R23 has been included to allow for one of several input stages to be used. Each input stage consists of an amplifying stage connected to an MR head. Each amplifying stage is connected in a dot-OR configuration to the input to the differential cascode stage at nodes n3 and n4. FIG. 7 shows only one such stage consisting of transistors Q17, Q18, Q19a, Q19b, Q26, and Q27, resistors Re, R17 and R18 and head Rh. Biasing for all input amplifiers is common at node n5. Transistor switches Q19 are then switched ON or OFF by a control signal at node nc to supply the biasing current to any one of the several input amplifier stages. Concurrently with the aforesaid control signal, control signals at nodes na and nb are also appropriately changed to allow the reference biasing current J1 to bias the appropriate head element. Nodes n1, n2, n3, n4, n5 and n6 are common to both each separate input stage and to a part of the amplifier common to all input stages. Control signals at nodes na, nb and nc are peculiar only to each individual input stage of which only one can be turned on at any one time.

Bias current J5 is made variable to accommodate a fast switching mode which occurs immediately after a switchover. A switchover includes switching from one read head to another or from a standby or write mode to a read mode in a disk file system. A signal of known time duration is sent to the preamplifier by external logic circuitry immediately following a switchover, whereby current J5 is increased for the duration of the timing signal. Increasing J5 by a factor of N will correspondingly increase the loop gain of the second feedback loop by N and thus increase the dominant low frequency pole by N. If N is sufficiently large, the otherwise long linear exponential decay associated with the transient response during a switchover can be shortened considerably. Since the charging current and discharging current are also increased by N, any slew rate limiting factor associated with adjusting the voltage across capacitor C1 will also be reduced in short order. Since, during this temporary high gain mode immediately following a switchover, the loop gain has changed, so then has the steady state error at Vo. The steady state error for the nominal case in the high gain mode can be made the same as the steady state error for the nominal case in the normal lower gain mode by also temporarily applying another feedforward current J6. This temporary application of feedforward only during the high gain mode serves to minimize the transient response time in general.

Figure 9:
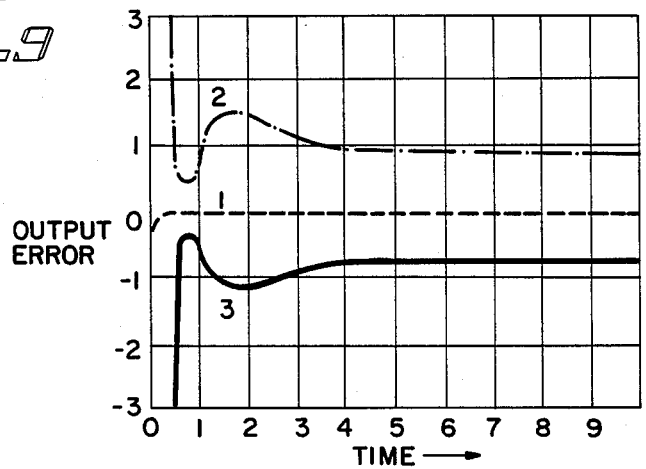
FIG. 9 is a graph showing the transient response during head switching of the preamplifier of FIG. 8 for three separate conditions.

The general transient response as seen at Vo is shown in FIG. 9. Here, three different transient responses are shown. Response 1 is that associated with switching from a head of nominal resistance to another head of the same resistance. Since this case is exactly what the temporary feedforward current $J_6$ was designed for, the transient time is the shortest possible. Response 2 represents a switchover from a head of the lowest specified resistance to a head of the highest specified resistance, while response 3 is the reverse of response 2. In responses 2 and 3, it becomes apparent that the transient response in general is dominated by several distinct effects. The first and most predominant effect is that of the slew rate limitation in the high gain mode immediately following a switchover. This effect is minimized by the aforementioned increase in charging/discharging current available for the capacitor C1. After the slew rate limitation has subsided, the increased pole frequency of the second feedback loop improves the linear decay to steady state N times faster than expected with the normal loop response. After the high gain mode ends (in this case at 10 $\mu$s), the normal loop gain of the second feedback loop responds to a change in the steady state error between the high gain and low gain modes for the non-nominal general case. After this response decays, then the remainder of the transient response is dominated by the lowest pole frequency found in the first feedback loop.

While the invention has been particularly shown and described with reference to a preferred embodiment thereof, it will be understood by those skilled in the art that various other changes in the form and details may be made therein without departing from the spirit and scope of the invention.

Having thus described our invention, what we claim as new, and desire to secure by Letters Patent is:

1. A protection circuit for a magnetoresistive element comprising;
   a magnetoresistive element having a first and a second terminal;
   a first current source coupled to said first terminal of said MR element for producing a bias current through said magnetoresistive element;
   a second current source coupled to said second terminal of said magnetoresistive element to produce a reference current;
   circuit means coupled across said first and said second terminals of said magnetoresistive element for sensing the center potential of said MR element substantially midway between said first and said second terminal; and feedback circuit means responsive to the sensed center potential of said magnetoresistive element to adjust the current output of said first current source to maintain said center potential to a predetermined reference voltage.

2. The circuit according to claim 1 wherein said circuit means comprises two equal resistors connected in series across said magnetoresistive element; and means for sensing the center potential of said magnetoresistive element at the junction between the two resistors.

3. The circuit according to claim 2 wherein said feedback circuit means comprises a differential amplifier having two input terminals and an output terminal;

means for connecting the sensed center potential to one of said input terminals;

means for connecting said predetermined reference voltage to the other of said input terminals; and means for coupling the output of said amplifier to control the current output of said first current source.

4. The circuit according to claim 3 wherein said predetermined reference voltage is ground potential.

5. The circuit according to claim 3 wherein said predetermined reference voltage is a small negative voltage.

6. A circuit for amplifying signals produced by a magnetoresistive element comprising;

a magnetoresistive element having a first and a second terminal;

a first current source coupled to said first terminal of said MR element for producing a bias current through said magnetoresistive element;

a second current source coupled to said second terminal of said magnetoresistive element to produce a reference current;

circuit means coupled across said first and said second terminals of said magnetoresistive element for sensing the center potential of said MR element substantially midway between said first and said second terminal;

a first feedback circuit means responsive to the sensed center potential of said magnetoresistive element to adjust the current output of said first current source to maintain said center potential to a predetermined reference voltage; and means for amplifying the signal voltage across said magnetoresistive element produced as a function of the magnetic flux being sensed by said magnetoresistive element.

7. The circuit according to claim 6 wherein said circuit means comprises two equal resistors connected in series across said magnetoresistive element; and means for sensing the center potential of said magnetoresistive element at the junction between the two resistors.

8. The circuit according to claim 7 wherein said first feedback circuit means comprises a differential amplifier having two input terminals and an output terminal;

means for connecting the sensed center potential to one of said input terminals;

means for connecting said predetermined reference voltage to the other of said input terminals; and means for coupling the output of said amplifier to control the current output of said first current source.

9. The circuit according to claim 8 wherein said predetermined reference voltage is ground potential.

10. The circuit according to claim 8 wherein said predetermined reference voltage is a small negative voltage.

11. The circuit according to claim 6 wherein said means for amplifying the signal voltage includes a second feedback circuit, said second feedback circuit being coupled to feed back a portion of the voltage sensed across said magnetoresistive element to remove the dc voltage due to said bias current and leave only said signal voltage.

12. The circuit according to claim 11 wherein said circuit means comprises two equal resistors connected in series across said magnetoresistive element; and means for sensing the center potential of said magnetoresistive element al the junction between the two resistors.

13. The circuit according to claim 12 wherein said feedback circuit means comprises a differential amplifier having two input terminals and an output terminal;

means for connecting the sensed center potential to one of said input terminals;

means for connecting said predetermined reference voltage to the other of said input terminals; and means for coupling the output of said amplifier to control the current output of said first current source.

14. The circuit according to claim 13 wherein said predetermined reference voltage is ground potential.

15. The circuit according to claim 13 wherein said predetermined reference voltage is a small negative voltage.

16. The circuit according to claim 10 wherein said second feedback circuit comprises an input circuit having at least two transistors coupled in a differential pair configuration and having the magnetoresistive element coupled between the bases of said transistors, a reference resistor connected between the emitters of said transistors, and a transconductance stage coupled between the collectors of said transistors, said transconductance stage having an output coupled to said transistors to supply a feedback current to maintain the dc current through each of said transistors equal so that only the signal voltage due to the magnetic flux being sensed by said magnetoresistive element is coupled to a output terminal.

17. The circuit according to claim 16 wherein said circuit means comprises two equal resistors connected in series across said magnetoresistive element; and means for sensing the center potential of said magnetoresistive element al the junction between the two resistors.

18. The circuit according to claim 17 wherein said feedback circuit means comprises a differential amplifier having two input terminals and an output terminal;

means for connecting the sensed center potential to one of said input terminals;

means for connecting said predetermined reference voltage to the other of said input terminals; and means for coupling the output of said amplifier to control the current output of said first current source.

19. The circuit according to claim 18 wherein said predetermined reference voltage is ground potential.

20. The circuit according to claim 18 wherein said predetermined reference voltage is a small negative voltage.

21. A circuit for amplifying signals produced by a selected one of a plurality of magnetoresistive elements, said circuit comprising;
- a plurality of input circuits, each input circuit comprising an amplifying circuit coupled to a magnetoresistive element, each said magnetoresistive element having a first and a second terminal;
- a cascode circuit having input and output terminals, and means for coupling each of said amplifying circuits to the input terminals of said cascde circuit;
- switching means to select one of said input circuits;
- a first current source, and means for coupling said first current source to said first terminal of said selected magnetoresistive element to produce a bias current through said selected magnetoresistive element;
- a second current source, and means for coupling said second current source to said second terminal of said selected magnetoresistive element to produce a reference current;
- circuit means coupled across said first and said second terminals of said selected magnetoresistive element for sensing
- the center potential of said selected magnetoresistive element;
- feedback circuit means responsive to the sensed center potential of said selected magnetoresistive element to adjust the current output of said first current source to maintain said center potential to a predetermined reference voltage; and
- coupling the signal at the output terminal of said cascode circuit to provide a signal voltage as a function of the magnetic flux being sensed by said selected magnetoresistive element.

22. The circuit according to claim 21 wherein said circuit means comprises two equal resistors connected in series across said magnetoresistive element; and
- means for sensing the center potential of said magnetoresistive element at the junction between the two resistors.

23. The circuit according to claim 22 wherein said feedback circuit means comprises a differential amplifier having two input terminals and an output terminal;
- means for connecting the sensed center potential to one of said input terminals;
- means for connecting said predetermined reference voltage to the other of said input terminals; and
- means for coupling the output of said amplifier to control the current output of said first current source.

24. The circuit according to claim 23 wherein said predetermined reference voltage is ground potential.

25. The circuit according to claim 23 wherein said predetermined reference voltage is a small negative voltage.

* * * * *